(12) United States Patent
Shimoda et al.

(10) Patent No.: US 10,643,811 B2
(45) Date of Patent: May 5, 2020

(54) TERMINAL CONNECTION STRUCTURE AND ELECTROMAGNETIC RELAY USING SAME

(71) Applicant: OMRON Corporation, Kyoto (JP)

(72) Inventors: Seiki Shimoda, Kumamoto (JP);
Masaaki Abe, Kumamoto (JP)

(73) Assignee: Omron Corporation, Kyoto (JP)

( * ) Notice: Subject to any disclaimer, the term of this patent is extended or adjusted under 35 U.S.C. 154(b) by 127 days.

(21) Appl. No.: 15/560,282

(22) PCT Filed: Mar. 8, 2016

(86) PCT No.: PCT/JP2016/057152
§ 371 (c)(1),
(2) Date: Sep. 21, 2017

(87) PCT Pub. No.: WO2016/167050
PCT Pub. Date: Oct. 20, 2016

(65) Prior Publication Data
US 2018/0075993 A1 Mar. 15, 2018

(30) Foreign Application Priority Data
Apr. 13, 2015 (JP) .................................. 2015-081730

(51) Int. Cl.
*H01H 9/02* (2006.01)
*H01H 50/02* (2006.01)
(Continued)

(52) U.S. Cl.
CPC .......... *H01H 50/02* (2013.01); *H01H 50/021* (2013.01); *H01R 13/03* (2013.01);
(Continued)

(58) Field of Classification Search
CPC ...... H01H 50/02; H01H 50/443; H01H 50/08; H01H 50/06; H01H 50/36; H01H 50/14; H01R 13/03; H01R 31/06; H05K 1/119
(Continued)

(56) References Cited

U.S. PATENT DOCUMENTS 4,587,502 A * 5/1986 Matsuo .............. H01H 51/2209
335/202
4,969,842 A  11/1990 Davis
(Continued)

FOREIGN PATENT DOCUMENTS

CN  1387239 A  12/2002
CN  100351973 C  11/2007
(Continued)

OTHER PUBLICATIONS

Office Action issued in German Application No. 11 2016 001 716.2, dated Apr. 10, 2019 (9 pages).
(Continued)

*Primary Examiner* — Shawki S Ismail
*Assistant Examiner* — Lisa N Homza
(74) *Attorney, Agent, or Firm* — Osha Liang LLP (57) ABSTRACT

A terminal connection structure with a good material yield and high productivity, free of mounting failure. The terminal connection structure is provided with: a base including a terminal hole, a fixed contact terminal portion, a through hole passing through the fixed contact terminal portion along its shaft center and communicating with the terminal hole, and a conductive film formed in a continuous manner on an inner circumferential surface of the terminal hole, an inner circumferential surface of the through hole, and an exposed surface of the fixed contact terminal portion; and a touch
(Continued)

piece press-fitted into the terminal hole and electrically connected to the fixed contact terminal portion via the conductive film.

14 Claims, 11 Drawing Sheets (51) Int. Cl.
*H01R 13/03* (2006.01)
*H01R 31/06* (2006.01)
*H05K 1/11* (2006.01)
*H01R 12/57* (2011.01)
*H01H 50/14* (2006.01)
*H01H 50/44* (2006.01)
*H01R 12/73* (2011.01)

(52) U.S. Cl.
CPC ............ *H01R 31/06* (2013.01); *H05K 1/119* (2013.01); *H01H 50/14* (2013.01); *H01H 50/443* (2013.01); *H01R 12/57* (2013.01); *H01R 12/732* (2013.01); *H05K 2201/09145* (2013.01); *H05K 2203/107* (2013.01)

(58) Field of Classification Search
USPC ........................................................ 335/202
See application file for complete search history.

(56) References Cited

U.S. PATENT DOCUMENTS

| 5,626,483 | A | 5/1997 | Naitoh |
| 6,225,880 | B1* | 5/2001 | Kern ....................... H01H 49/00 335/78 |
| 6,340,923 | B1 | 1/2002 | Yamanaka et al. |
| 6,575,769 | B1 | 6/2003 | Takeuchi et al. |
| 6,924,719 | B2* | 8/2005 | Saruwatari ............. H01H 50/08 335/17 |
| 7,283,026 | B2* | 10/2007 | Nakamura ........... H01H 50/043 335/202 |
| 7,573,360 | B2* | 8/2009 | Bryan .................... H01H 1/605 335/201 |
| 2002/0036556 | A1* | 3/2002 | Matsuda ................ H01H 50/12 335/78 |
| 2002/0064986 | A1* | 5/2002 | Hirai .................... H01R 13/035 439/181 |
| 2002/0170173 | A1 | 11/2002 | Mashino |
| 2005/0057332 | A1* | 3/2005 | Nakamura ........... H01H 50/042 335/128 |
| 2009/0051602 | A1* | 2/2009 | Jeon ....................... H05K 1/119 343/700 R |
| 2009/0115444 | A1 | 5/2009 | Okuda et al. |
| 2011/0083889 | A1 | 4/2011 | Niitsu et al. |
| 2018/0144895 | A1* | 5/2018 | Shimoda ................ H01H 50/04 |

FOREIGN PATENT DOCUMENTS

| CN | 101313438 A | 11/2008 |
| CN | 103165635 A | 6/2013 |
| JP | S63-44791 A | 2/1988 |
| JP | H03-173080 A | 7/1991 |
| JP | H04-278597 A | 10/1992 |
| JP | H06-260236 A | 9/1994 |
| JP | H08-022853 A | 1/1996 |
| JP | H08-148240 A | 6/1996 |
| JP | 2000-500907 A | 1/2000 |
| JP | 2000-260506 A | 9/2000 |
| JP | 2005-294161 A | 10/2005 |
| JP | 2009-004284 A | 1/2009 |
| JP | 2009-259712 A | 11/2009 |

OTHER PUBLICATIONS

International Search Report issued in PCT/JP2016/057152 dated Jun. 7, 2016 (2 pages).
Written Opinion of the International Searching Authority issued in PCT/JP2016/057152 dated Jun. 7, 2016 (3 pages).
Office Action issued in Chinese Application No. 201680017141.1, dated Aug. 30, 2018 (11 pages).
Notification of Reasons for Refusal issued in Japanese Application No. 2015-081730, dated Sep. 11, 2018 (8 pages).

* cited by examiner

TERMINAL CONNECTION STRUCTURE AND ELECTROMAGNETIC RELAY USING SAME

TECHNICAL FIELD

The present invention generally relates to a connection structure of a terminal vertically provided on a base.

BACKGROUND

Conventionally, as a terminal connection structure concerned with an electronic component, for example, there has been disclosed an electromagnetic relay where, while an electromagnetic portion is formed on one side of the upper surface of a base, a contact mechanism portion is formed on the remaining one side on the upper surface of the base, the upper end of a movable iron piece is coupled with the contact mechanism portion via a card, the movable iron piece rotating while being attracted to or separated from the upper end of an iron core based on excitation and demagnetization of the electromagnetic portion, and the contact mechanism portion is driven by the card that horizontally reciprocates based on the excitation and demagnetization of the electromagnetic portion, to open or close contacts. In the electromagnetic relay, a shaft portion provided at the lower end of the movable iron piece is fitted with a recess for positioning provided in a basal portion of a spool, and the shaft portion of the movable iron piece is rotatably prevented from coming off by a magnetic pole portion located at the lower end of the iron core assembled to the spool. (See Patent Document 1).

In the electromagnetic relay, as illustrated in FIGS. 2 and 3 of Patent Document 1, there has been disclosed a terminal connection structure where a movable touch piece 35 and a fixed touch piece 30 are respectively press-fitted into terminal holes 18, 19 provided on a base 10, and terminal portions thereof are respective projected from the lower surface of the base 10.

PRIOR ART DOCUMENT

Patent Document

Patent Document 1: Japanese Unexamined Patent Publication No. 2005-294161

SUMMARY

However, in the foregoing terminal connection structure, the movable touch piece 35 and the fixed touch piece 30 having the terminal portions are press-fitted to the base 10 to be integrated. This causes an ineffective cutting layout in the case of cutting the movable touch piece 35 and the fixed touch piece 30 out of a conductive sheet material, thus leading to high production cost.

Further, it is necessary to press-fit the terminal portions of the movable touch piece 35 and the fixed touch piece 30 from the upper surface of the base 10 and make the terminal portions project from the lower surface of the base 10. For this reason, positioning and assembly operations take time and trouble to lower productivity.

Especially, the terminal portions of the movable touch piece 35 and the fixed touch piece 30 are plastically deformable because being formed of the conductive sheet material. At the time of mounting an electronic component, provided with the terminal portion as described above, on a printed circuit board, when the terminal portion is plastically deformed, it may cause mounting failure.

One or more embodiments of the present invention is to provide a terminal connection structure with a good material yield, high productivity, free of mounting failure.

In one or more embodiments a terminal connection structure according to the present invention is made up of: a base that includes a terminal hole a terminal projection, a through hole passing through the terminal projection along a shaft center of the terminal projection and communicating with the terminal hole, and a conductive film formed in a continuous manner on an inner circumferential surface of the terminal hole, an inner circumferential surface of the through hole, and an exposed surface of the terminal projection; and a touch piece press-fitted into the terminal hole and electrically connected to the terminal projection via the conductive film.

According to one or more embodiments of the present invention, just press-fitting the lower end of the touch piece into the terminal hole in the base enables electrical connection to the terminal projection. This may eliminate the need to provide a terminal portion in the touch piece, and the touch piece having a simple shape like a strip can serve a necessary purpose, thereby enabling improvement in material yield.

Further, since all it takes is to include the simply shaped touch piece in the assembly, positioning and assembly operations become easier, to improve productivity.

With the terminal projection provided on the base, unlike the conventional example, the terminal portion is not plastically deformed and the mounting failure does not occur.

As one or more embodiments of the present invention, metal-plating may be performed on a region where the inner circumferential surface of the terminal hole, the inner circumferential surface of the through hole, and the exposed surface of the terminal projection are irradiated with laser light and a metal powder may be deposited, to form the conductive film.

According to one or more embodiments, the continuous conductive film is formed through laser irradiation and metal-plating, thereby facilitating automatization of a production process required for electric connection, and further improving the productivity.

In one or more embodiments another terminal connection structure according to the present invention is made up of a base that includes a touch piece, a terminal projection, a through hole passing through the terminal projection along a shaft center of the terminal projection and being open to a basal portion of the touch piece, and a conductive film formed in a continuous manner on a front surface of the touch piece, an inner circumferential surface of the terminal hole, a region connecting from the front surface of the touch piece to the inner circumferential surface of the through hole, and an exposed surface of the terminal projection. In the terminal connection structure, the touch piece integrally molded to the base is electrically connected to the terminal projection via the conductive film.

According to one or more embodiments of the present invention, since the touch piece can be formed by being integrally molded to the base, the number of parts and the number of assembly steps are reduced to obtain a terminal connection structure with high productivity.

With the terminal projection provided on the base, unlike the conventional example, the terminal portion is not plastically deformed and the mounting failure does not occur.

As one or more embodiments of the present invention, metal-plating may be performed on a region where the front surface of the touch piece, the inner circumferential surface of the through hole, the region connecting from the front surface of the touch piece to the inner circumferential surface of the through hole, and the exposed surface of the terminal projection are irradiated with laser light and a metal powder may be deposited, to form the conductive film.

According to one or more embodiments, the continuous conductive film is formed through laser irradiation and metal-plating, thereby facilitating automatization of a production process required for electric connection, and further improving the productivity.

In one or more embodiments according to the present invention, the inner circumferential surface of the through hole may have a tapered surface.

When the inner circumferential surface of the through hole has the tapered surface such as a truncated cone or a truncated square, an etching operation by using laser light becomes easier to further improve the productivity.

In one or more embodiments of the present invention, pre-solder may be made to adhere to at least the exposed surface of the terminal projection.

According to one or more embodiments, it may be possible to obtain a terminal connection structure where a connection process as the next process can be performed in an easy and reliable manner.

An electromagnetic relay according to one or more embodiments of the present invention may be provided with the foregoing terminal connection structure.

According to one or more embodiments of the present invention, just press-fitting the lower end of the touch piece into the terminal hole in the base enables electrical connection to the terminal projection. This may eliminate the need to provide a terminal portion in the touch piece, and the touch piece may only have a simple shape like a strip, thereby enabling improvement in material yield.

Further, since all it takes is to include the simply shaped touch piece in the assembly, the positioning and assembly operations and obtaining an electromagnetic relay may be facilitated with high productivity.

DETAILED DESCRIPTION

Embodiments of a terminal connection structure according to the present invention will be described in accordance with the accompanied drawings of FIGS. 1 to 28.

In the following description, in describing configurations represented in the drawings, terms showing directions such as "up", "down", "left", and "right", and other terms including those, will be used. It is noted that the purpose for using those terms is to facilitate understanding of the embodiments through the drawings. Accordingly, those terms do not necessarily show directions used at the time of actually using the embodiments of the present invention. A technical scope of the invention recited in the claims shall not be restrictively interpreted by using those terms.

As illustrated in FIGS. 1 to 13, one or more embodiments are the case of applying a terminal connection structure according to the present invention to an electromagnetic relay.

Figure 1:
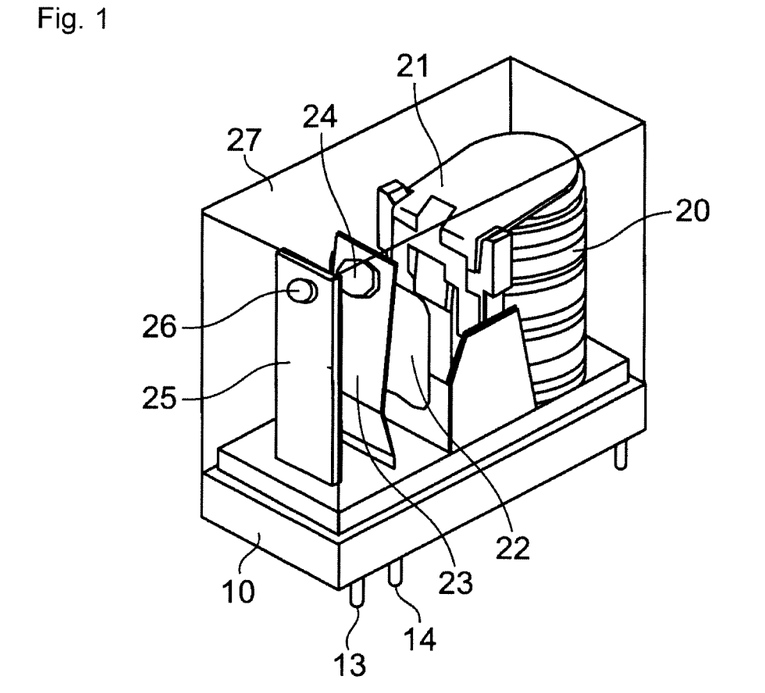
FIG. 1 is a perspective view of an electromagnetic relay, to which one or more embodiments of a terminal connection structure according to the present invention has been applied.

That is, as illustrated in FIG. 1, the electromagnetic relay is provided with: a base 10; an electromagnetic device 20; a movable iron piece 21 having a substantially L-shaped cross section and rotating based on excitation and demagnetization of the electromagnetic device 20; a card 22 that reciprocates and moves as the movable iron piece 21 rotates; a movable touch piece 23 that is pressed by the card 22; and a fixed touch piece 25 having a fixed contact 26, which a movable contact 24 provided in the movable touch piece 23 comes into contact with or separates from, the electromagnetic device 20, the movable iron piece 21, the card 22, the movable touch piece 23, and the fixed touch piece 25 being vertically provided on the base 10. The internal components such as the electromagnetic device 20 are covered by a cover 27 fitted to the base 10.

Next, a description will be given of a connection process for the movable touch piece 23 and the fixed touch piece 25 which are vertically provided on the base 10 in accordance with the accompanied drawings of FIGS. 2 to 13.

Figure 2:
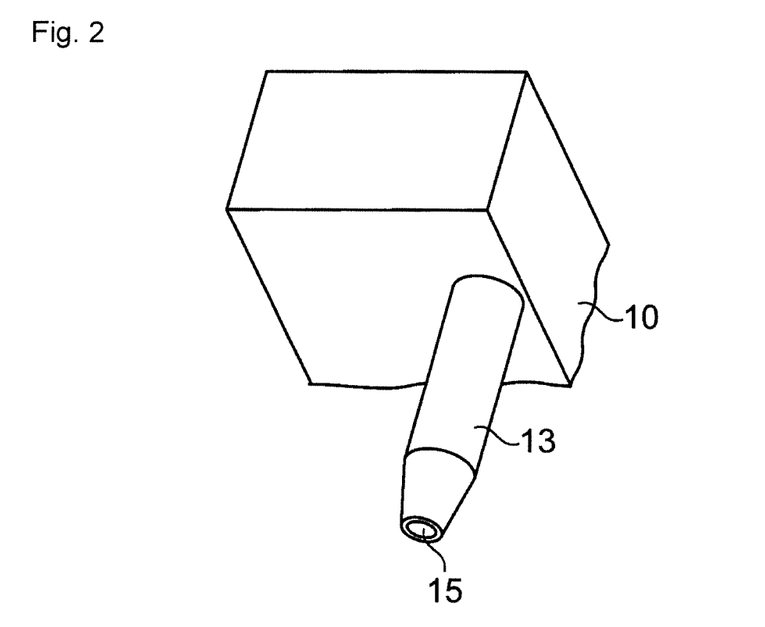
FIG. 2 is a partial perspective view illustrating a base of the electromagnetic relay illustrated in FIG. 1.
Figure 3:
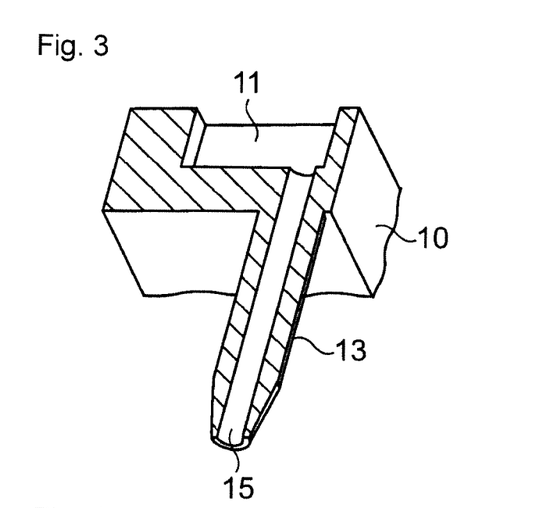
FIG. 3 is a longitudinal sectional view of the base illustrated in FIG. 2.
Figure 4:
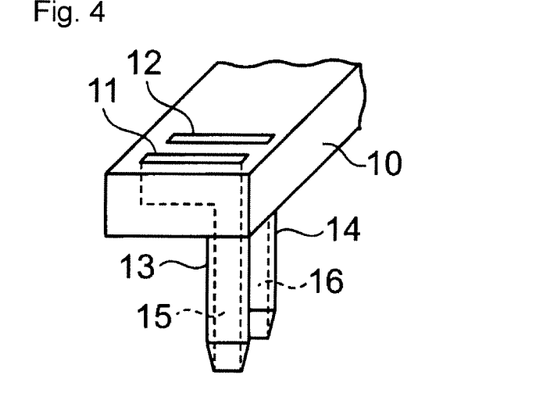
FIG. 4 is a perspective view for describing a manufacturing process for the base according to the electromagnetic relay illustrated in FIG. 1.
Figure 5:
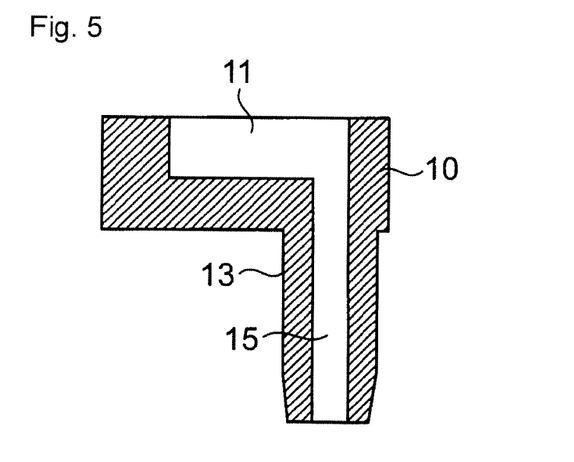
FIG. 5 is a longitudinal sectional view of the base illustrated in FIG. 4.
Figure 6:
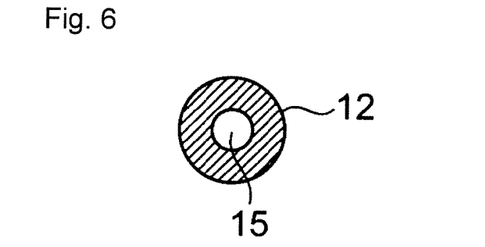
FIG. 6 is a cross-sectional view of the base illustrated in FIG. 4.

First, as illustrated in FIGS. 2 to 4, terminal holes 11, 12 are formed on the upper surface of the base 10. Further, a fixed contact terminal portion 13 and a movable contact terminal portion 14 are integrally molded with the lower surface of the base 10. The terminal holes 11, 12 are respectively communicated with through holes 15, 16 that pass through the fixed contact terminal portion 13 and the movable contact terminal portion 14.

A molding material for the base 10 contains a base polymer, a filler, and a metal powder. Examples of the base polymer include a liquid crystal polymer (LCP) and polybutylene terephthalate (PBT).

Note that each of the through holes 15, 16 is not restricted to a simple cylindrical form, but may have a tapered surface such as a truncated cone or a truncated square. This has the advantage of facilitating laser irradiation and improving the productivity.

Figure 7:
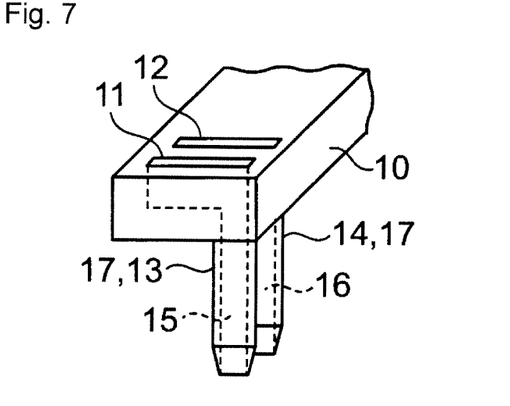
FIG. 7 is a perspective view for describing the manufacturing process subsequent to FIG. 4.
Figure 8:
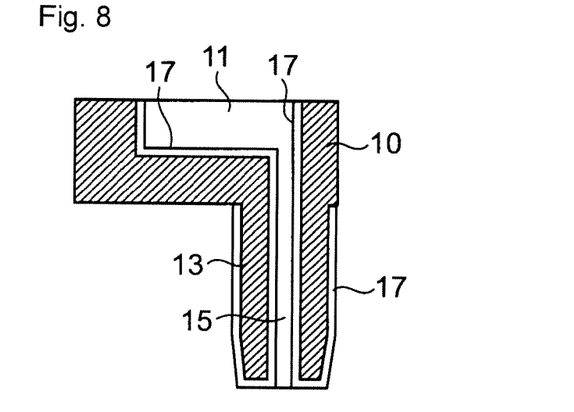
FIG. 8 is a longitudinal sectional view of the base illustrated in FIG. 7.
Figure 9:
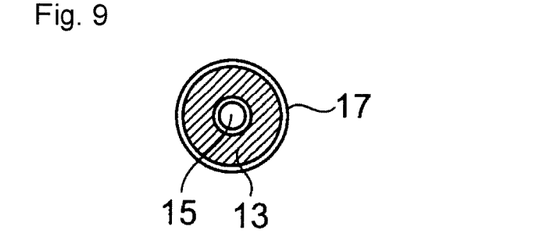
FIG. 9 is a cross-sectional view of the base illustrated in FIG. 7.
Figure 10:
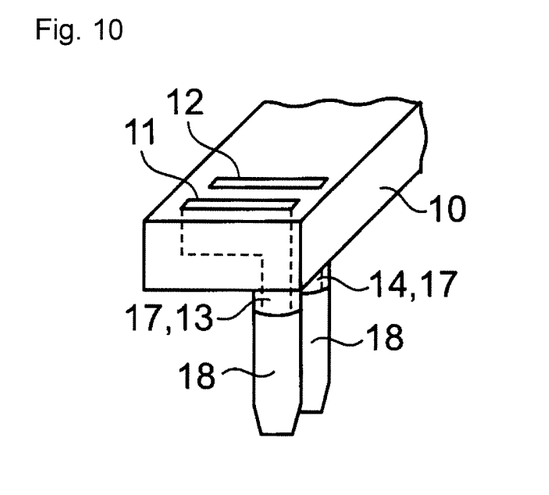
FIG. 10 is a perspective view for describing the manufacturing process subsequent to FIG. 7.
Figure 11:
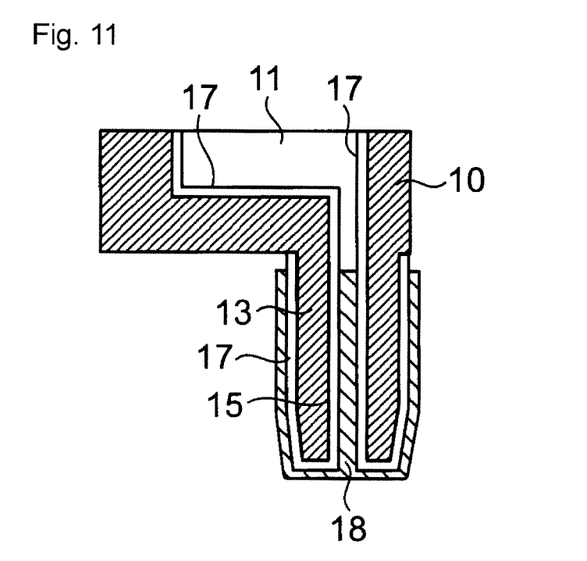
FIG. 11 is a longitudinal sectional view of the base illustrated in FIG. 10.
Figure 12:
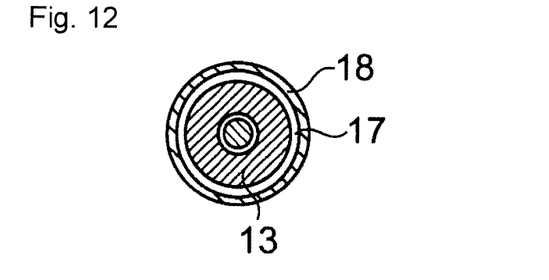
FIG. 12 is a cross-sectional view of the base illustrated in FIG. 10.

Then, the inner circumferential surfaces of the terminal holes 11, 12, the inner circumferential surfaces of the through holes 15, 16, and the exposed surfaces of the fixed contact terminal portion 13 and the movable contact terminal portion 14 are irradiated with laser light to deposit the metal powder contained in the molding material. Further, the base 10 is soaked into a plating tank, not illustrated, to plate the metal-powder deposited surface with copper and/or nickel, etc., to form a conductive film (FIGS. 7 to 9). Subsequently, the fixed contact terminal portion 13 and the movable contact terminal portion 14 are soaked into a molten solder tank to make pre-solder 18 adhere to the exposed surfaces of the fixed contact terminal portion 13 and the movable contact terminal portion 14 and the insides of the through holes 15, 16 (FIGS. 10 to 13).

Note that the pre-solder 18 may be made to adhere after completion of assembly of the electromagnetic relay.

Figure 13:
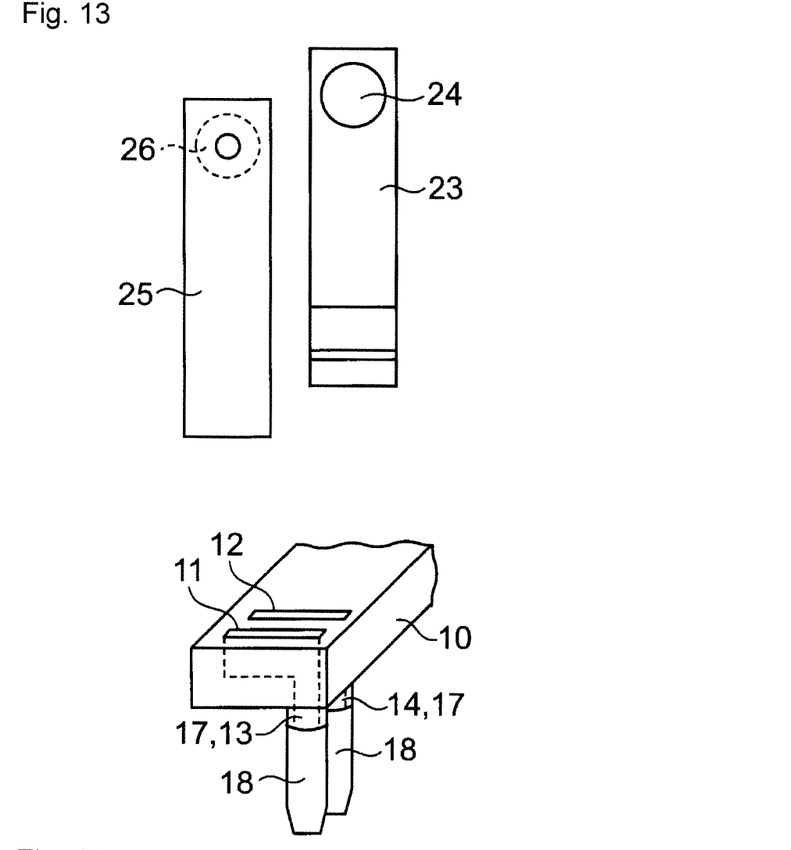
FIG. 13 is a perspective view for describing the manufacturing process subsequent to FIG. 10.

Next, as illustrated in FIG. 13, the fixed touch piece 25, having a strip shape, is press-fitted into the terminal hole 11, to electrically connect between the fixed touch piece 25 and the outer circumferential surface of the fixed contact terminal portion 13. Similarly, the movable touch piece 23, having a strip shape, is press-fitted into the terminal hole 12, to electrically connect between the movable touch piece 23 and the outer circumferential surface of the movable contact terminal portion 14.

Figure 14:
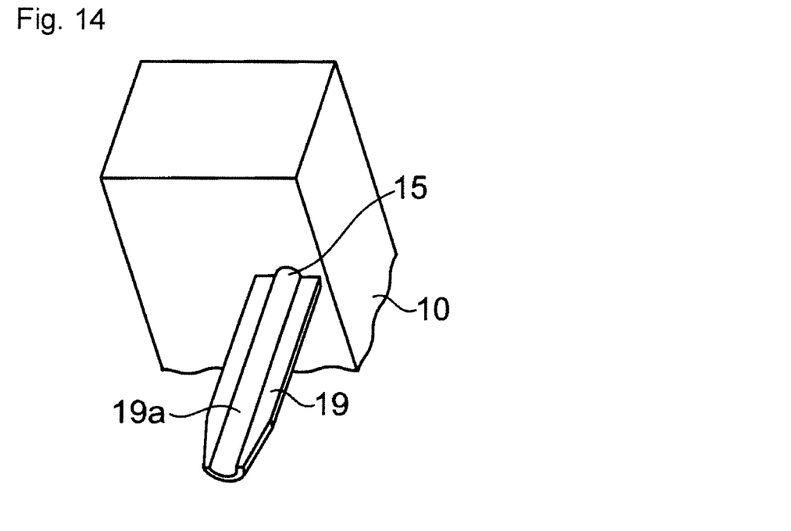
FIG. 14 is a perspective view illustrating one or more embodiments of the terminal connection structure according to the present invention.

As illustrated in FIG. 14, one or more embodiments are obtained by providing in a projecting manner a terminal projection 19 with a semicircular cross section on the bottom surface of the base 10, and forming a groove portion 19a with a semicircular cross section which communicates with the through hole 15. Since the others are similar to those in one or more embodiments, the same portions are provided with the same numerals, and descriptions thereof are omitted.

Due to the exposure of the groove portion 19a communicating with the through hole 15, one or more embodiments have the advantage of facilitating etching by laser light and improving the productivity.

Figure 15:
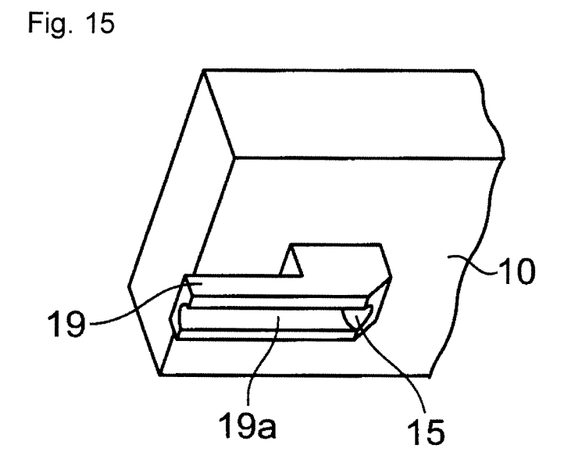
FIG. 15 is a perspective view illustrating one or more embodiments of the terminal connection structure according to the present invention.
Figure 16:
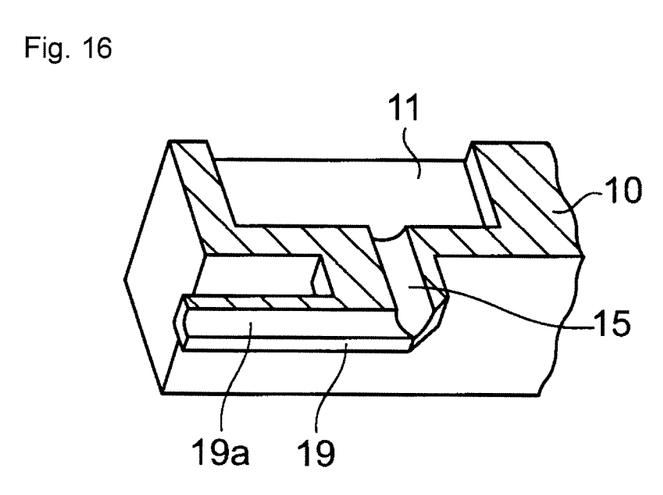
FIG. 16 is a longitudinal sectional view of FIG. 15.

As illustrated in FIGS. 15 and 16, one or more embodiments are obtained by integrally molding the terminal projection 19, which has a substantially L-shaped cross section, to the bottom surface of the base 10 and forming the groove portion 19a, which has a semicircular cross section and communicates with the through hole 15, on the lower surface of the terminal projection 19.

One or more embodiments the advantage of being capable of surface-mounting on a printed circuit board and enhancing design freedom.

As illustrated in FIGS. 17 to 23, one or more embodiments are the case of applying the terminal connection structure according to the present invention to an electromagnetic relay that can be mounted on the surface of the printed circuit board. Since a basic configuration is almost the same as one or more embodiments described above, the same portions are provided with the same numerals, and only different respects will be described.

First, in the same manner as in one or more embodiments, a plate-like body to be a fixed touch piece 25a is integrally molded to the upper surface of the base 10 by using a molding material containing a base polymer, a filler, and a metal powder. The fixed contact terminal portion 13 is then integrally molded to the lower surface of the base 10. Simultaneously, the through hole 15 is provided in the basal portion of the fixed touch piece 25a, the through hole 15 passing through the fixed contact terminal portion 13 along its shaft center.

Similarly, the terminal hole 12 for press-fitting of the movable touch piece 23 is provided on the upper surface of the base 10. The movable contact terminal portion 14 is then integrally molded to the lower surface of the base 10. Simultaneously, the through hole 16 is provided in a position adjacent to the terminal hole 12, the through hole 16 passing through the movable contact terminal portion 14 along its shaft center.

Figure 17:
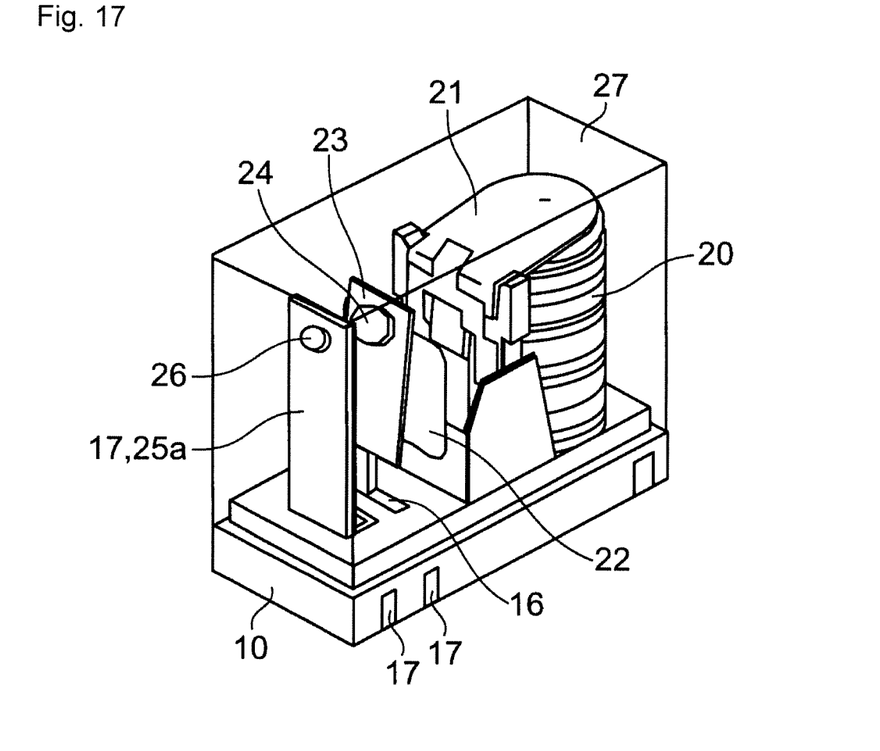
FIG. 17 is a perspective view of an electromagnetic relay, to which one or more embodiments of the terminal connection structure according to the present invention has been applied.
Figure 18:
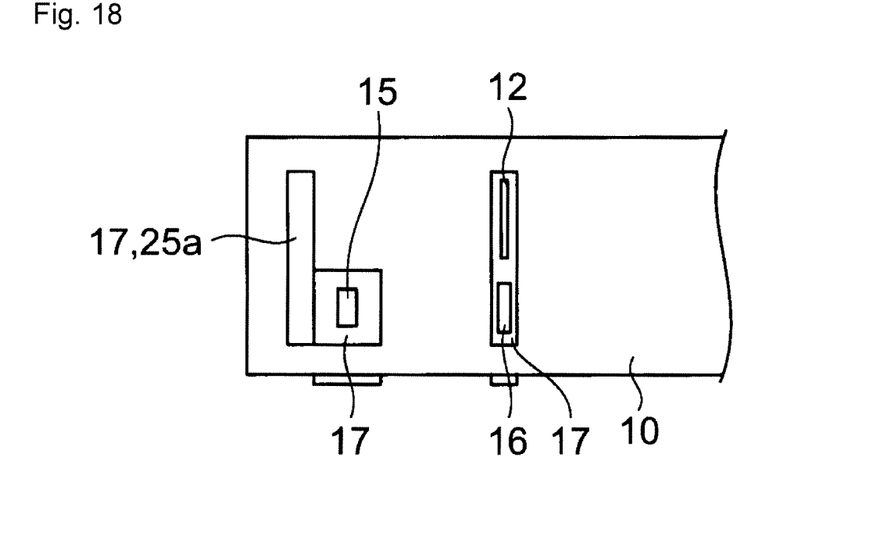
FIG. 18 is a partial plan view of the base illustrated in FIG. 17.
Figure 19:
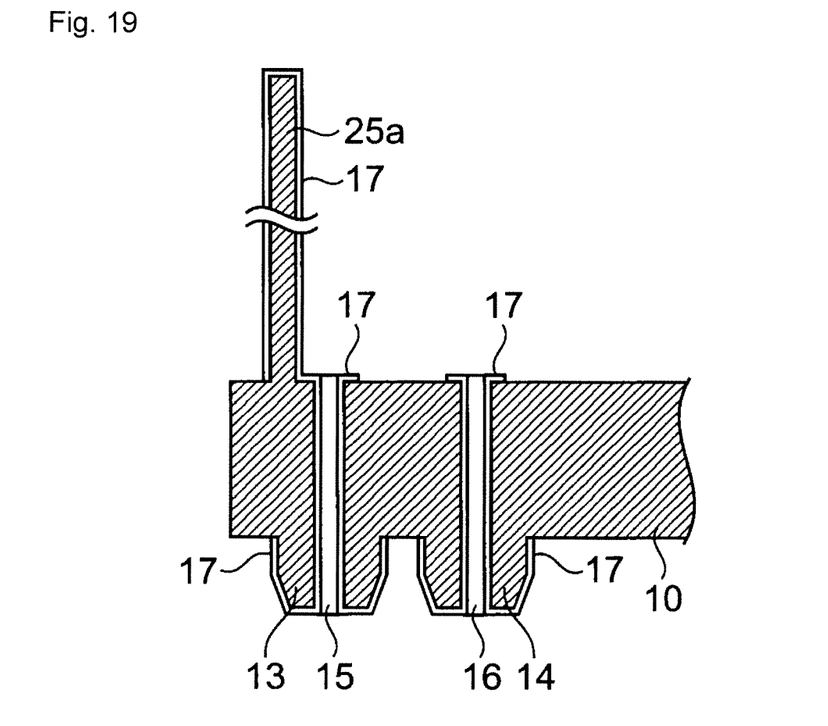
FIG. 19 is a longitudinal sectional view of the base illustrated in FIG. 18.
Figure 20:
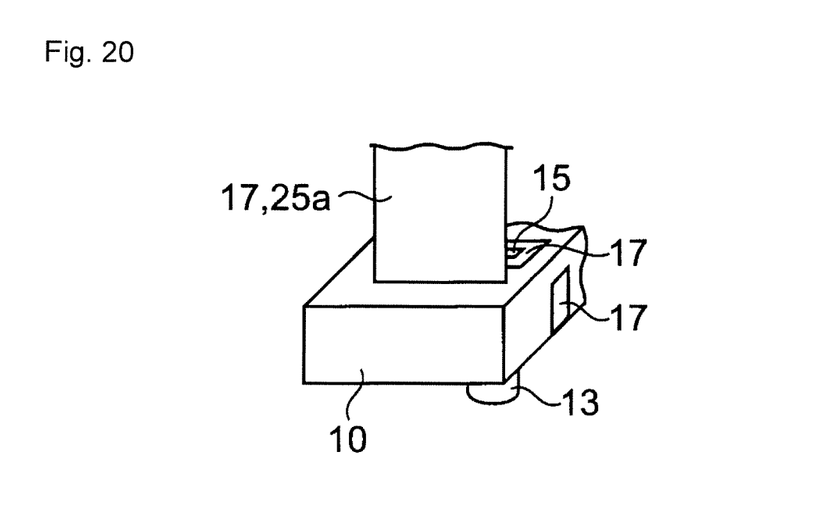
FIG. 20 is a partial perspective view of the base illustrated in FIG. 17.
Figure 21:
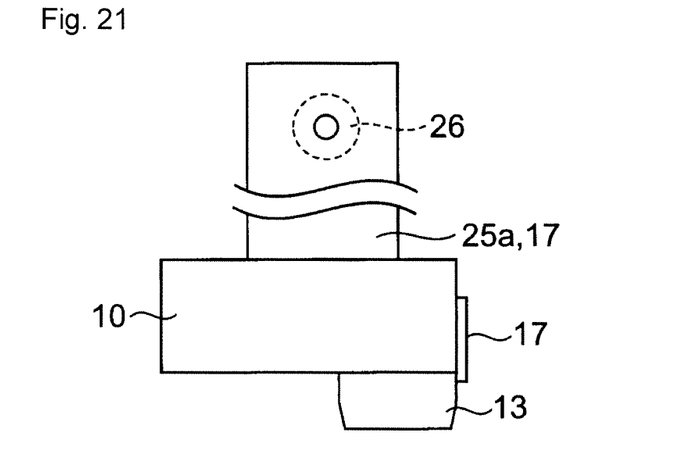
FIG. 21 is a front view of the base illustrated in FIG. 17.

Then, the front surface of the fixed touch piece 25a, the inner circumferential surface of the through hole 15, a region connecting from the front surface of the fixed touch piece 25a to the inner circumferential surface of the through hole 15, and the exposed surface of the fixed contact terminal portion 13 are etched by laser light to deposit a metal powder.

Similarly, the inner circumferential surfaces of the terminal hole 12 and the through hole 16, a region connecting from the terminal hole 12 to the through hole 16, and the exposed surface of the movable contact terminal portion 14 are etched by laser light to deposit a metal powder.

Naturally, the etching processing by laser light does not need to be performed on the entire surface of the fixed touch piece 25a, for example, but may be restrictively performed on a necessary region.

The base 10 is then soaked into a plating tank, not illustrated, to plate the metal-powder deposited surface with copper and/or nickel, etc., to form a conductive film (FIGS. 18 and 19). Note that, if necessary, the fixed contact terminal portion 13 and the movable contact terminal portion 14 of the base 10 may be soaked in advance into a molten solder tank for adhesion of pre-solder.

Figure 22:
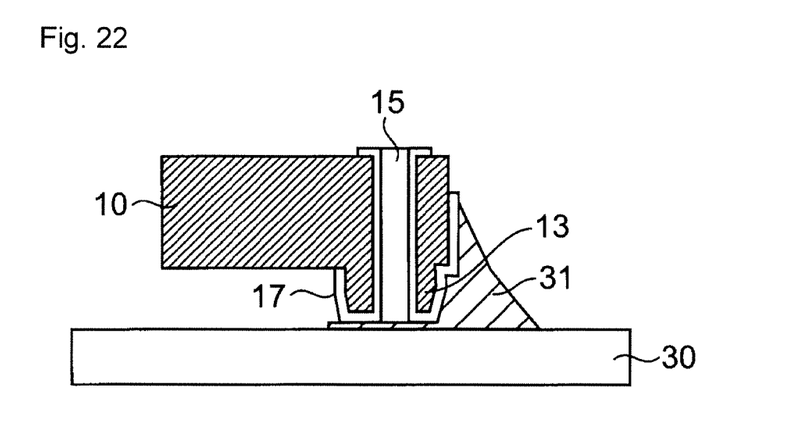
FIG. 22 is a longitudinal sectional view for describing a method to mount the base illustrated in FIG. 17 on a printed circuit board.

Next, when the electromagnetic relay having the base 10 is to be mounted on the surface of a printed circuit board 30, for example as illustrated in FIG. 22, the fixed contact terminal portion 13 of the base 10 is mounted on the surface of the printed circuit board 30. Then, solder 31 is made to adhere to a conductive film 17 exposed from the side surface of the base 10 to electrically connect between the printed circuit board 30 and the conductive film 17.

Since the solder 31 is made to adhere to the conductive film 17 exposed from the side surface of the base 10 to electrically connect between the printed circuit board 30 and the conductive film 17, one or more embodiments have the advantage of facilitating the connecting operation and improving the productivity.

Figure 23:
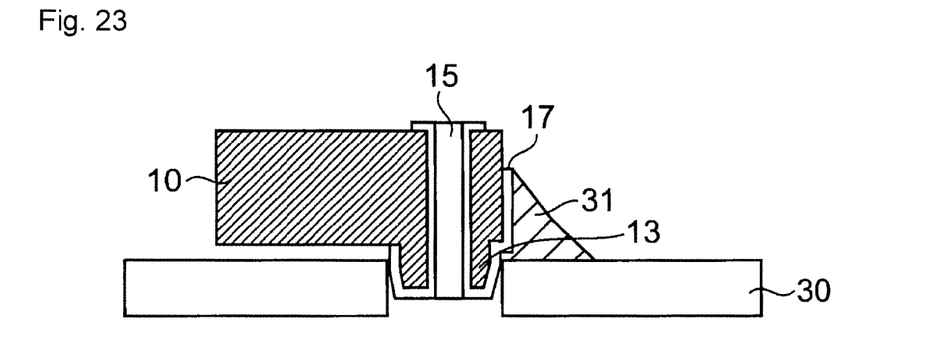
FIG. 23 is a longitudinal sectional view for describing another method to mount the base illustrated in FIG. 17 on the printed circuit board.

The electromagnetic relay is not restricted to the foregoing connection structure. As illustrated in FIG. 23, the fixed contact terminal portion 13 of the base 10 may be fitted into a through hole 32 provided in the printed circuit board 30, and electric connection may be made by the solder 31.

According to one or more embodiments, the base 10 hardly falls off the printed circuit board 30, and a highly reliable terminal connection structure is thus obtained.

In any of the one or more embodiments, the fixed contact terminal portion 13 and the movable contact terminal portion 14 are not plastically deformed as in the conventional example, and any of the embodiments thus has the advantage of causing no mounting failure at the time of mounting the printed circuit board 30 on the electromagnetic relay. This also applies to a coil terminal portion.

Figure 24:
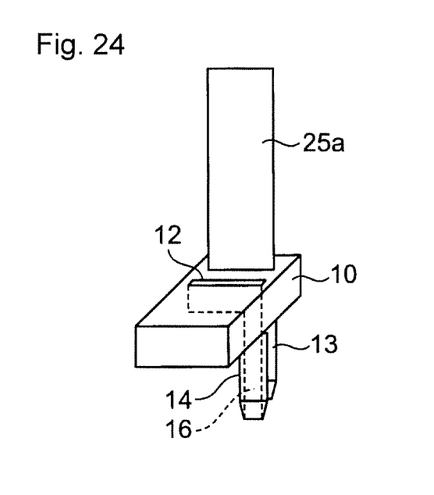
FIG. 24 is a perspective view for describing a manufacturing process for a base of an electromagnetic relay, to which one or more embodiments of the terminal connection structure according to the present invention has been applied.
Figure 25:
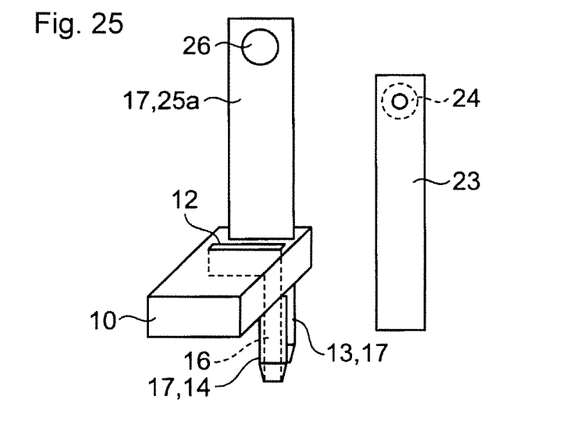
FIG. 25 is a perspective view for describing the manufacturing process subsequent to FIG. 24.
Figure 26:
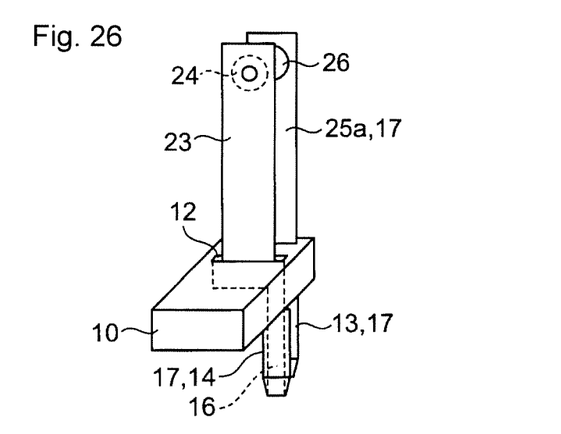
FIG. 26 is a perspective view for describing the manufacturing process subsequent to FIG. 25.

As illustrated in FIGS. 24 to 26, one or more embodiments are the case of applying the terminal connection structure according to the present invention to an electromagnetic relay made up of the fixed touch piece 25a integrally molded to the base 10 and the movable touch piece 23 press-fitted into the terminal hole 12 in the base 10 to be electrically connected.

As in one or more embodiments, the fixed touch piece 25a according to the embodiment is electrically connected to the fixed contact terminal portion 13 via a through hole (not illustrated) provided in the base 10. Further, as in one or more embodiments, the movable touch piece 23 according to one or more embodiments is electrically connected to the movable contact terminal portion 14 provided in a projecting manner on the lower surface of the base 10.

Since the others are similar to those in one or more embodiments, the same portions are provided with the same numerals, and descriptions thereof are omitted.

Figure 27:
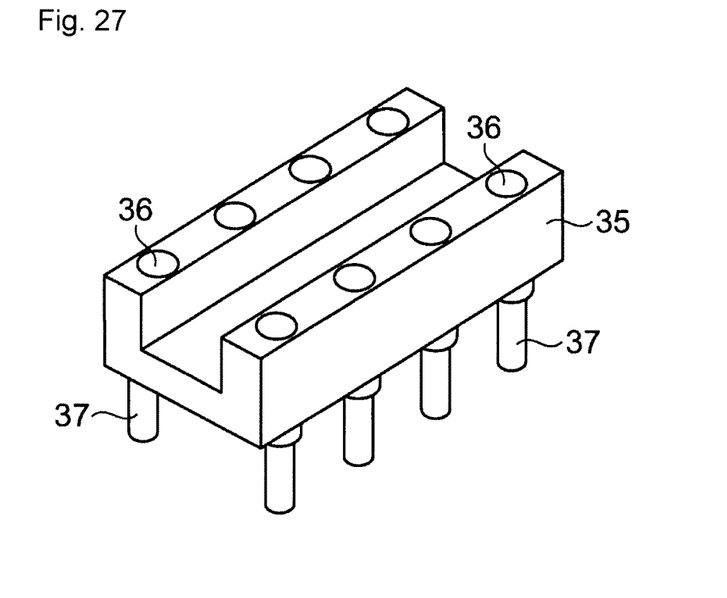
FIG. 27 is a perspective view illustrating a connector, to which one or more embodiments of the terminal connection structure according to the present invention has been applied.
Figure 28:
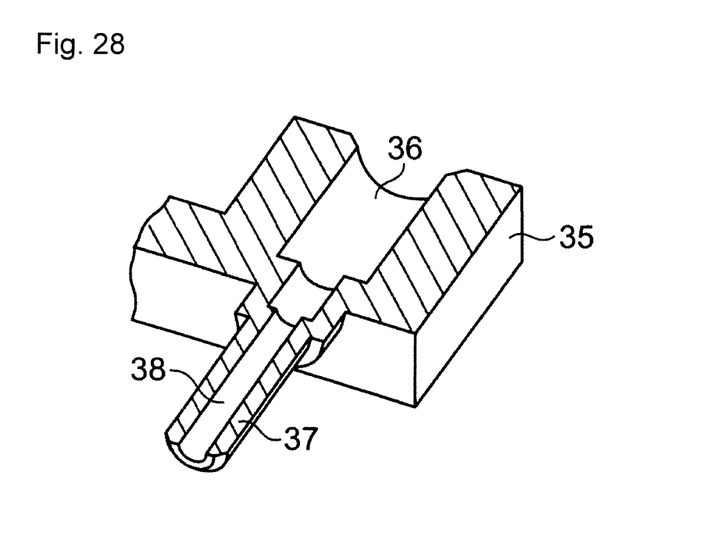
FIG. 28 is a longitudinally sectional perspective view of the connector illustrated in FIG. 27.

The terminal connection structure according to one or more embodiments the present invention is not restricted to the foregoing electromagnetic relays, but may, for example, be applied to a connector 35 as in one or more embodiments illustrated in FIGS. 27 and 28.

That is, the connector 35 is formed by integrally molding terminal holes 36 at both edges of the upper surface of the connector 35 with terminal projections 37 on the lower surface of the connector 35 by a resin material containing a metal powder. The terminal hole 36 communicates with a through hole 38 passing through the terminal projection 37 along its shaft center.

Note that the operations of performing etching by laser light after resin molding, depositing the metal powder, and then performing metal-plating with copper or nickel to form a conductive film are similar to those in one or more embodiments, and hence the descriptions thereof are omitted.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

INDUSTRIAL APPLICABILITY

A terminal connection structure according to the present invention is not restricted to the one or more embodiments, but is also applicable to other relays, switches, IC sockets, and the like.

DESCRIPTION OF SYMBOLS 10 base
11 terminal hole
12 terminal hole
13 fixed contact terminal portion (terminal projection)
14 movable contact terminal portion (terminal projection)
15 through hole
16 through hole
17 conductive film
18 pre-solder
19 terminal projection
20 electromagnetic device
21 movable iron piece
22 card
23 movable touch piece
24 movable contact
25 fixed touch piece
25a fixed touch piece
26 fixed contact
27 cover
30 printed circuit board
31 solder
35 connector
36 terminal hole
37 terminal projection
38 through hole

The invention claimed is:

1. A terminal connection structure comprising:
    a base comprising:
        a base body having a first surface and a second surface opposite to the first surface;
        a terminal hole opened on the first surface;
        a terminal projection projected from the second surface in a direction away from the first surface;
        a through hole passing through the terminal projection along a shaft center of the terminal projection, extending to the terminal hole and communicating with the terminal hole; and
        a conductive film formed in a continuous manner on an inner circumferential surface of the terminal hole, an inner circumferential surface of the through hole, and an exterior surface of the terminal projection; and
    a touch piece press-fitted into the terminal hole and electrically connected to the conductive film.

2. The terminal connection structure according to claim 1, wherein metal-plating is performed on a region where the inner circumferential surface of the terminal hole, the inner circumferential surface of the through hole, and the exterior surface of the terminal projection are irradiated with laser light and a metal powder is deposited, to form the conductive film.

3. The terminal connection structure according to claim 2, wherein the inner circumferential surface of the through hole has a tapered surface.

4. The terminal connection structure according to claim 2, wherein pre-solder is made to adhere to at least the exterior surface of the terminal projection.

5. The terminal connection structure according to claim 1, wherein the inner circumferential surface of the through hole has a tapered surface.

6. The terminal connection structure according to claim 5, wherein pre-solder is made to adhere to at least the exterior surface of the terminal projection.

7. The terminal connection structure according to claim 1, wherein pre-solder is made to adhere to at least the exterior surface of the terminal projection.

8. An electromagnetic relay comprising the terminal connection structure according to claim 1.

9. A terminal connection structure comprising
a base comprising:
   a touch piece;
   a terminal projection;
   a through hole passing through the terminal projection along a shaft center of the terminal projection and being open to a basal portion of the touch piece; and
   a conductive film formed in a continuous manner on a front surface of the touch piece, an inner circumferential surface of the through hole, a region connecting from the front surface of the touch piece to the inner circumferential surface of the through hole, and an exposed surface of the terminal projection,
wherein the touch piece integrally molded to the base is electrically connected to the terminal projection via the conductive film.

10. The terminal connection structure according to claim 9, wherein metal-plating is performed on a region where the front surface of the touch piece, the inner circumferential surface of the through hole, the region connecting from the front surface of the touch piece to the inner circumferential surface of the through hole, and the exposed surface of the terminal projection are irradiated with laser light and a metal powder is deposited, to form the conductive film.

11. The terminal connection structure according to claim 10, wherein the inner circumferential surface of the through hole has a tapered surface.

12. The terminal connection structure according to claim 10, wherein pre-solder is made to adhere to at least the exposed surface of the terminal projection.

13. The terminal connection structure according to claim 9, wherein the inner circumferential surface of the through hole has a tapered surface.

14. The terminal connection structure according to claim 9, wherein pre-solder is made to adhere to at least the exposed surface of the terminal projection.

* * * * *